United States Patent
Berman et al.

[11] Patent Number: 6,102,960
[45] Date of Patent: Aug. 15, 2000

[54] AUTOMATIC BEHAVIORAL MODEL GENERATION THROUGH PHYSICAL COMPONENT CHARACTERIZATION AND MEASUREMENT

[75] Inventors: Charles E. Berman, Moorpark; Jon N. Powell, Camarillo, both of Calif.

[73] Assignee: Synopsys, Inc., Mountain View, Calif.

[21] Appl. No.: 09/027,950

[22] Filed: Feb. 23, 1998

[51] Int. Cl.$^7$ .................................... G06F 17/50
[52] U.S. Cl. .................... 703/17; 703/13; 703/16
[58] Field of Search ............... 371/15.1; 395/500.05, 395/500.07, 500.26, 500.35; 703/3–5

[56] References Cited

U.S. PATENT DOCUMENTS

| | | | |
|---|---|---|---|
| 4,525,789 | 7/1985 | Kemper et al. | 702/117 |
| 4,736,338 | 4/1988 | Saxe et al. | 364/900 |
| 5,001,714 | 3/1991 | Stark et al. | 371/26 |
| 5,025,402 | 6/1991 | Winkelstein | 364/578 |
| 5,043,987 | 8/1991 | Stark et al. | 371/26 |
| 5,051,938 | 9/1991 | Hyduke | 364/578 |
| 5,068,814 | 11/1991 | Stark et al. | 364/580 |
| 5,157,668 | 10/1992 | Buenzli, Jr. et al. | 714/26 |
| 5,313,398 | 5/1994 | Rohrer et al. | 364/468 |
| 5,394,121 | 2/1995 | Cipolla et al. | 333/124 |
| 5,548,539 | 8/1996 | Vlach et al. | 364/578 |
| 5,555,201 | 9/1996 | Dangelo et al. | 364/489 |
| 5,610,833 | 3/1997 | Chang et al. | 364/491 |
| 5,623,418 | 4/1997 | Rostoker et al. | 364/489 |
| 5,625,578 | 4/1997 | Du Cloux et al. | 364/578 |
| 5,625,803 | 4/1997 | McNelly et al. | 395/500 |
| 5,633,812 | 5/1997 | Allen et al. | 364/578 |
| 5,774,382 | 6/1998 | Tyler et al. | 364/578 |

*Primary Examiner*—Kevin J. Teska
*Assistant Examiner*—Lonnie A. Knox
*Attorney, Agent, or Firm*—D'Alessandro & Ritchie

[57] ABSTRACT

A method and a system for generating a behavioral model for a device having a plurality of driver pins and receiver pins. The method and system includes connecting the plurality of driver and receiver pins to a test apparatus including an input stimulation means, a voltage measurement means, and a current measurement means, stimulating a first set of the plurality of receiver pins using the input stimulation means, performing voltage measurements at selected ones of the plurality of driver pins using the voltage measurement means, stimulating a second set of the plurality of receiver pins using the input stimulation means, performing current measurements at selected ones of the plurality of driver pins using the current measurement means, and creating the behavioral model using the voltage measurements and the current measurements.

61 Claims, 8 Drawing Sheets

Model 16244_BI
see 16244 bi.log for details of spi2mod run
266 DRIVERSPEC 16244_BI BI /260 /262 /264
  THRS: 0.800 2.000 —268
  UNDER_OVER: 0.000 5.000 /272
276 LEFF: 10.000 —274 \—270 /278
282 LOW 16244_LOW VM: 1.500 FALLTIME: 6.250
  HIGH 16244_HIGH VM: 1.500 RISETIME: 5.500
  SHUNT 16244_SHUNT —284
              —288
            /290   /292   /294
296 DEF_RISE 18 POINTS V: 2.500 R: 50.000
  DEF_POINT PT: 0.000 PV: 0.000 —298
  DEF_POINT PT: 0.045 PV: 0.000
  DEF_POINT PT: 0.136 PV: 0.006
  DEF_POINT PT: 0.182 PV: 0.012
  DEF_POINT PT: 0.227 PV: 0.021
  DEF_POINT PT: 0.273 PV: 0.028
  DEF_POINT PT: 0.318 PV: 0.042
  DEF_POINT PT: 0.364 PV: 0.066
  DEF_POINT PT: 0.409 PV: 0.099
  DEF_POINT PT: 0.455 PV: 0.140
  DEF_POINT PT: 0.500 PV: 0.201
  DEF_POINT PT: 0.591 PV: 0.375
  DEF_POINT PT: 0.636 PV: 0.471
  DEF_POINT PT: 0.727 PV: 0.682
  DEF_POINT PT: 0.818 PV: 0.849
  DEF_POINT PT: 0.864 PV: 0.915
  DEF_POINT PT: 0.955 PV: 0.990
  DEF_POINT PT: 1.000 PV: 1.000
          /300    /302    /304
306 DEF_FALL 16 POINTS V: 2.500 R: 50.000
  DEF_POINT PT: 0.000 PV: 1.000 —308
  DEF_POINT PT: 0.280 PV: 0.981
  DEF_POINT PT: 0.400 PV: 0.926
  DEF_POINT PT: 0.480 PV: 0.823
  DEF_POINT PT: 0.560 PV: 0.665
  DEF_POINT PT: 0.600 PV: 0.574
  DEF_POINT PT: 0.640 PV: 0.454
  DEF_POINT PT: 0.680 PV: 0.370
  DEF_POINT PT: 0.720 PV: 0.274
  DEF_POINT PT: 0.760 PV: 0.190
  DEF_POINT PT: 0.800 PV: 0.118
  DEF_POINT PT: 0.840 PV: 0.067
  DEF_POINT PT: 0.880 PV: 0.035
  DEF_POINT PT: 0.920 PV: 0.011
  DEF_POINT PT: 0.960 PV: 0.001
  DEF_POINT PT: 1.000 PV: 0.000

LOADSPEC 16244_LOW —310
V-I: 11 POINTS —312
314 POINT V: −0.100 I: −10.000 —316
  POINT V: 0.000 I: −0.420
  POINT V: 0.100 I: 9.390
  POINT V: 0.300 I: 28.080
  POINT V: 0.700 I: 62.970
  POINT V: 1.100 I: 92.170
  POINT V: 1.500 I: 114.090
  POINT V: 2.000 I: 131.830
  POINT V: 2.600 I: 141.770
  POINT V: 3.800 I: 144.620
  POINT V: 5.100 I: 144.620

LOADSPEC 16244_HIGH —318
V-I: 13 POINTS —320
322 POINT V: −0.100 I: −238.800 —324
  POINT V: 1.100 I: −162.680
  POINT V: 2.300 I: −74.790
  POINT V: 2.800 I: −37.990
  POINT V: 3.000 I: −24.460
  POINT V: 3.100 I: −18.350
  POINT V: 3.200 I: −12.720
  POINT V: 3.300 I: −7.950
  POINT V: 3.400 I: −3.960
  POINT V: 3.500 I: −1.410
  POINT V: 3.600 I: −0.270
  POINT V: 3.800 I: −0.050
  POINT V: 5.100 I: −0.020

LOADSPEC 16244_SHUNT —326
CEFF: 5.00 —328
Capacitance has been Defaulted
V-I: 9 POINTS —330
332 POINT V: −2.000 I: −263.729 —334
  POINT V: −1.200 I: −263.729
  POINT V: −1.000 I: −144.887
  POINT V: −0.900 I: −88.577
  POINT V: −0.800 I: −45.776
  POINT V: −0.700 I: −14.525
  POINT V: −0.600 I: −0.834
  POINT V: 0.100 I: 0.000
  POINT V: 0.200 I: 0.000

*FIG. 9*

AUTOMATIC BEHAVIORAL MODEL GENERATION THROUGH PHYSICAL COMPONENT CHARACTERIZATION AND MEASUREMENT

BACKGROUND OF THE INVENTION

1. Field of the Invention

The present invention relates to a method and system for generating behavioral models through physical component measurement. More particularly, the present invention provides an automated method and system for generating behavioral models compatible with signal integrity simulation software.

2. The Background Art

Creating behavioral models is a time-consuming process. Often, various tools are manually used to collect data which can then be used to create a behavioral model. These tools may include power supplies and oscilloscopes.

Power supplies, logic analyzers and oscilloscopes are typically used to verify and test digital circuits. However, manually using these tools for collection of data is a time-consuming process. A need exists for an automated method and system for controlling hardware and creating a behavioral model from measurements acquired using this hardware.

A behavioral model describes behavioral characteristics of a system according to inputs and corresponding outputs. For example, a behavioral model may be defined according to specified voltages placed at various input pins and corresponding voltages produced at corresponding output pins. In comparison, a functional model, in addition to providing such behavioral characteristics, includes circuit implementation details which are often considered to be proprietary in nature. For example, a functional model may include the components used to achieve specified behavioral characteristics, such as a NAND gate, as well as a description of pin connections among the specified components.

In addition to being time-consuming, the creation of behavioral models is often performed using output created by running a SPICE or similar computer simulation. However, in order to run a SPICE simulation, such as HSPICE, functional models of actual circuits are required. A system designed to create behavioral models without using a functional model would be desirable, since chip vendors and chip foundries are generally reluctant to provide such proprietary functional model information to their customers.

The final format of a behavioral model is often as important as the process used to create the behavioral model. One disadvantage of many behavioral models is that they are often encrypted to provide protection against unauthorized duplication or translation. Encryption is not desirable, since encrypted models cannot be modified by a customer at a later date. Accordingly, a need exists for a system for creating behavioral models which may be altered by the customer on an as-needed basis.

BRIEF DESCRIPTION OF THE INVENTION

The present invention provides a method and system for generating a behavioral model for a device through physical measurement of every driver, receiver and bidirectional pin on a component. Through a single process, behavioral models are created through component measurement. In this manner, creation of behavioral models compatible with signal integrity simulation software is automated to reduce the total time required to create each behavioral model.

According to a first aspect of the present invention, a behavioral model may be created for a device having a plurality of driver pins and a plurality of receiver pins. The method and system includes providing a test apparatus such as a device-under-test (DUT) board, connecting the device to the test apparatus, performing an AC risetime/falltime measurement for each one of the plurality of driver pins, performing a DC voltage sweep measurement for each one of the plurality of driver pins, performing a DC voltage sweep measurement for each one of the plurality of receiver pins, and generating the behavioral model for the device using the AC and DC measurements performed for each one of the plurality of driver pins and the DC measurement performed for each one of the plurality of receiver pins.

According to a second aspect of the present invention, a behavioral model may be created for one of the plurality of driver or bidirectional pins through component measurement. The method and system includes providing a test apparatus, connecting the device to the test apparatus, performing an AC risetime/falltime measurement for the driver pin, performing a DC voltage sweep for the driver pin in both a high and low state, and generating the behavioral model using a raw data transformation of both the AC and DC measurements performed for the driver or bidirectional pin.

According to a third aspect of the present invention, a behavioral model may be created for one of the plurality of receiver pins through component measurement. The method and system includes providing a test apparatus, connecting the device to the test apparatus, performing a DC voltage sweep measurement for the receiver pin and generating the behavioral model using the DC voltage sweep measurement.

The present invention allows a user to create a behavioral model from physical measurements of a component. This permits creation of a behavioral model in the absence of a functional model or other proprietary or more specific circuit information. This is important, since most signal integrity simulation software is designed for use with behavioral models rather than functional models. Moreover, since the system is automated, the present invention provides a more efficient means for creating a behavioral model. This allows a user to create a behavioral model using default settings, thereby eliminating the need for extensive knowledge of the component being modeled or the modeling process.

DETAILED DESCRIPTION OF THE PREFERRED EMBODIMENTS

In the following description, a preferred embodiment of the invention is described with regard to preferred process steps and data structures. However, those of ordinary skill in the art will recognize, after a perusal of this application, that embodiments of the invention may be implemented using one or more general purpose computers operating under program control, and that modification of such general purpose computers to implement the process steps and data structures described herein would not require undue experimentation or invention.

The present invention provides a method and system for generating behavioral models of a component for use with signal integrity simulation software such as Transmission-Line Calculator (TLC), Crosstalk Tool-Kit (XTK), and QUad Integrated EMI Toolkit (QUIET), all available from the Viewlogic Systems division of Synopsis, Inc. Data is captured throughout the operating range of the component. The present invention may be used with components such as memory chips, microprocessor chips, flip-flops, and ASICs. Components being modeled are preferably compatible with either IEEE 1149.1 JTAG boundary scan or another mechanism which permits the toggling of output pins, such as the availability of input test vectors. To ensure the quality of the modeling process, information is captured from multiple components and the results are averaged. The present invention may be implemented in software or firmware, as well as in programmable gate array devices, ASICs and other hardware.

Figure 1:
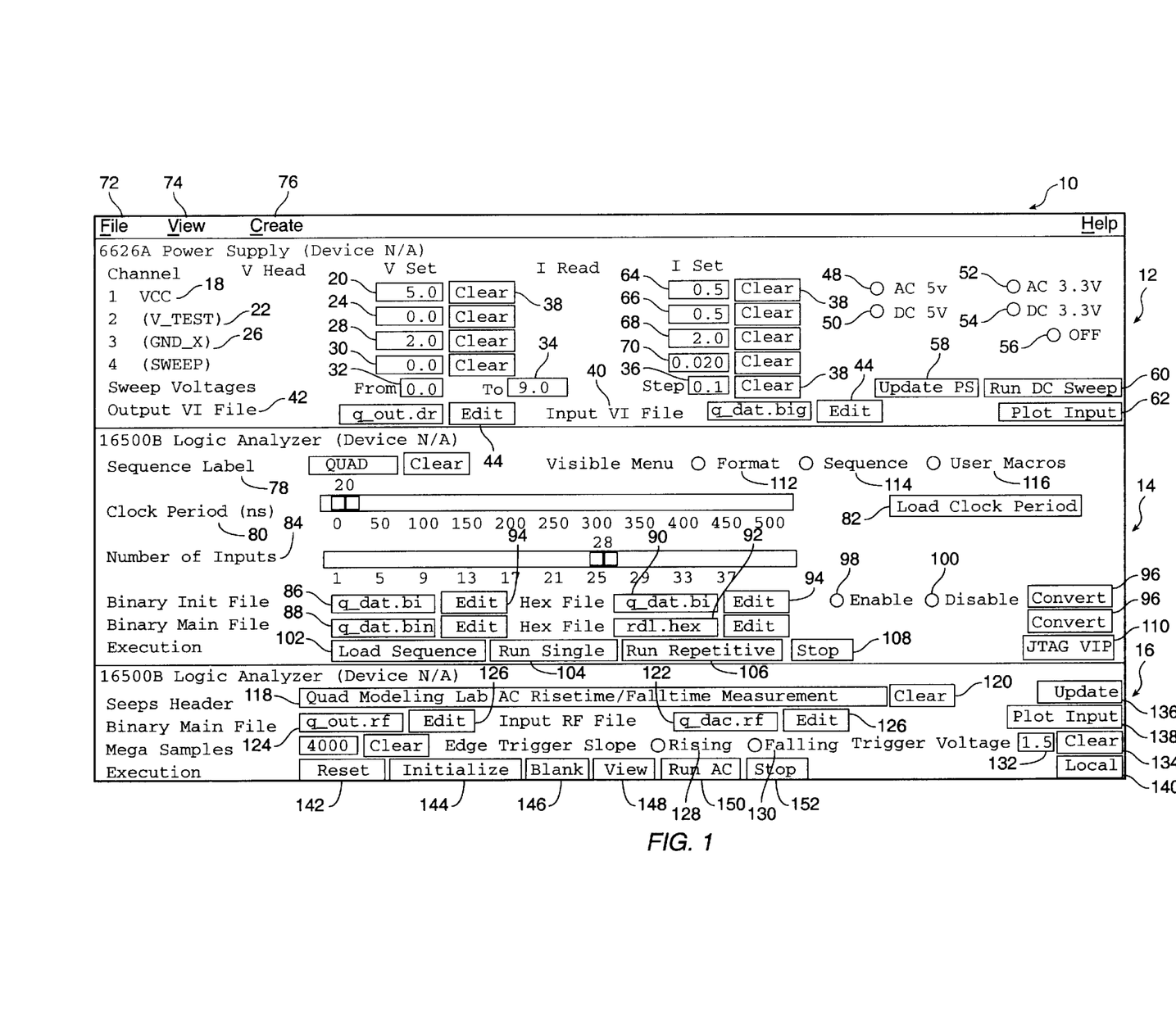
FIG. 1 illustrates a physical measurement control panel in accordance with a presently preferred embodiment of the present invention.

Referring first to FIG. 1, a control panel 10 according to a presently preferred embodiment of the present invention is presented. The panel 10 may be displayed on a general purpose computer display, as would be known to those of ordinary skill in the art. A first section 12 is provided to control a power supply. The power supply may comprise a multiple output linear system DC power supply (e.g., a Hewlett Packard model 6626A or similar device). A second section 14 is provided to control a logic analyzer. The logic analyzer comprises a logic analysis system (e.g., a Hewlett Packard model 16500B or similar device), a pattern generator module for use with the logic analysis system (e.g., Hewlett Packard model 16522A 200-M or similar device), and technology dependent pods for the logic analysis system. A logic analysis system typically includes a data acquisition module. The interface between the data acquisition module and the component being tested is called a pod. Thus, the logic analysis system allows data acquisition through use of the technology dependent pods. A third section 16 is used to control an oscilloscope. According to a presently preferred embodiment, a high precision oscilloscope, such as Hewlett packard model 54720D or an equivalent may be used. The present invention is implemented using two Pentium PCs, one which contains the control panel software running under a Linux operating system available from Red Hat of Durham, N.C., and one for the JTAG Vector Interface Package (VIP) software available from Corelis, Inc. of Cerritos, Calif., running under Windows-95 (a Microsoft® product). In addition, a General Purpose Interface Bus (GPIB) control card, such as that manufactured by National Instruments of Austin, Tex., model 776786-01 AT-GPIB/TNT and a NI-488.2 PC Plug-in Card for DOS/Windows are provided. Other arrangements could also be used as would be obvious to those of ordinary skill in the art. A configuration file is preferably used to provide default settings for the power supply, the logic analyzer, and the oscilloscope.

As shown in FIG. 1, the first section 12 of the control panel 10 allows a user to control a power supply. A first channel 18 may be set to a specified voltage VCC 20, a second channel 22 may be initialized to a specified voltage V TEST 24 to allow a DC voltage sweep to be performed across a user-specified range according to a specified interval, and a third channel 26 is set to GND 28. A sweep voltage 30 indicates current voltage during voltage sweep. The user-specified range may be defined by a first specified voltage 32 and a second specified voltage 34. A sweep interval 36 may further be defined. "Clear" buttons 38 allow a user to clear and update default values. However, default values may be left unaltered by the user. An input VI file 40 and output VI file 42 may also be specified using an "Edit" button 44. These files provide voltage and measured current. Default voltage values 46 may be provided during voltage sweep. For example, "AC 5V" 48, "DC 5V" 50, "AC 3.3V" 52, and "DC 3.3V" 54 may be specified. Selecting one of these options disables the previously selected option, allowing just one option to be set.

There are four channels contained within the power supply. Selecting "DC 5V" sets channel 1 (VCC) to 5.0 volts, disables channel 2 (V_TEST), sets channel 3 (GND) to 0 volts, and sets up channel 4 ($V_S$) for a voltage sweep of −2.0 to 7.0 volts in increments of 0.1 volts (100 mv). Selecting "AC 5V" sets channel 1 (VCC) to 5.0 volts, channel 2 (V_TEST) to 2.5 volts, channel 3 (GND) to 0 volts, and disables channel 4 (VS). Selecting "DC 3.3V" sets channel 1 (VCC) to 3.3 volts, disables channel 2 (V_TEST), sets channel 3 (GND) to 0 volts, and sets up channel 4 ($V_S$) for a voltage sweep of −1.0 to 5.3 volts in increments of 0.1 volts (100 mv). Selecting "AC 3.3V" sets channel 1 (VCC) to 3.3 volts, channel 2 (V_TEST) to 1.65 volts, channel 3 (GND) to 0 volts, and disables channel 4 ($V_S$). Alternatively, all four channels of the power supply may be turned off by selecting "Off" button 56.

Once a selection has been made, "Update PS" 58 may be selected to update the selected values for the Power Supply. Next, "Run DC Sweep" 60 may be selected to run a DC sweep with the entered voltage values. A Voltage vs. Current (VI) plot is automatically performed, and written out to the specified output file. In addition, an input file from a previous measurement may be plotted by selecting "Plot Input" 62. Thus, the "Plot Input" 62 selection may be used in the event the user elects to superimpose one voltage vs. current waveform over another voltage vs. current waveform. Similarly, current limits corresponding to the voltage values may be read and set 64–70. This protects the device from being damaged as a result of a large current being drawn. Options allowing a user to manipulate a file 72, view a file 74, or create a file 76 are provided to create and edit input files.

The second section 14 of the control panel 10 provides a user with the capability to initialize and control a logic analyzer. A sequence label 78 can be created to designate a reference to the device and pin being measured. A clock period 80 may be specified. As shown, the clock period may be specified in nanoseconds. For example, a range of 500 to 5 nanoseconds, which corresponds to a clock frequency of 2 MHz to 200 MHz respectively, is provided to allow the user to select the clock period. Once selected, the clock period may be loaded by selecting the "Load Clock Period" button 82. A number of inputs 84 corresponding to the number of required input pins for stimulation is selectable by a user.

A "Binary Initialization File" 86 and "Binary Main File" 88, as well as corresponding Hex Files 90–92 may be selected and edited using an "Edit" button 94. A "Convert" button 96 is provided to convert a binary initialization file to a hexadecimal format. However, this function may be enabled 98 or disabled 100 depending upon whether the device requires a vector initialization sequence. In addition, another "Convert" button 96 is provided to convert a binary main file to a hexadecimal format.

When a selected input file containing test vectors is to be executed, a "Load Sequence" button 102 may be selected. A "Run Single" button 104 is selected to allow a DC sweep to be performed. Alternatively a "Run Repetitive" button 106 may be selected to allow an AC risetime/falltime measurement to be performed. A "Stop" button 108 is provided to allow a user to indicate when AC risetime/falltime measurements are completed. According to a preferred embodiment of the present invention, a "JTAG VIP" button 110 is provided to invoke the JTAG VIP standalone software when boundary scan compliant devices are being modeled. Therefore, the additional Windows-95 based Pentium computer is not required. "Format" 112, "Sequence" 114, and "User Macros" 116 enable a user to switch between visible menus in order to display information corresponding to the logic analyzer without having to manually adjust the equipment. For example, the "Sequence" 114 selection allows a user to observe the test vectors, or test sequences, that are being loaded into the logic analyzer. "Format" 112 allows a user to verify all other characteristics of the set up, such as clock period, number of pods being used, number of inputs being used, and a sequence label. The "User Macros" 116 selection allows a user to create procedures to automate the functionality of the logic analyzer.

The third section 16 of the control panel 10 allows a user to control an oscilloscope. A "Scope Header" 118 may be selected or entered by a user. A "Clear" button 120 is provided for this purpose. The "Header" 118 may be used as a notes or message indicator to be displayed on the oscilloscope. An optional Input Rise/Fall (RF) file 122 may be selected using an "Edit" button 126. Similarly, an Output Rise/Fall (RF) File 124 may be selected using an "Edit" button 126. The edge may be captured on a rising or falling edge by selecting a "Rising" 128 or "Falling" 130 Edge Trigger Slope. In addition, a trigger voltage 132 may be specified using a "Clear" button 134. Once information is correct, a user may select the "Update" button 136 to update the oscilloscope. A "Plot Input" button 138 is provided in the event the user elects to superimpose one voltage vs. time waveform on top of another using the input file 122. In addition, a "Local" 140 selection allows a user to switch from remote mode to local mode for manual oscilloscope operation. This allows a user to perform troubleshooting without disrupting the equipment set up. In order to perform AC risetime/falltime measurements using the oscilloscope, a "Reset" button 142 is provided to reset all settings to a default state. An "Initialize" button 144 allows a user to initialize the oscilloscope to the values specified in the configuration file. A "Blank" button 146 is available to blank out the visible screen on the oscilloscope. A "View" button 148 allows a user to view the output file. A "Run AC" button 150 is selected to initiate AC risetime/falltime measurements and capture the data. A "Stop" button 152 is provided to terminate capturing of the results, similar to an "abort" operation.

Figure 2:
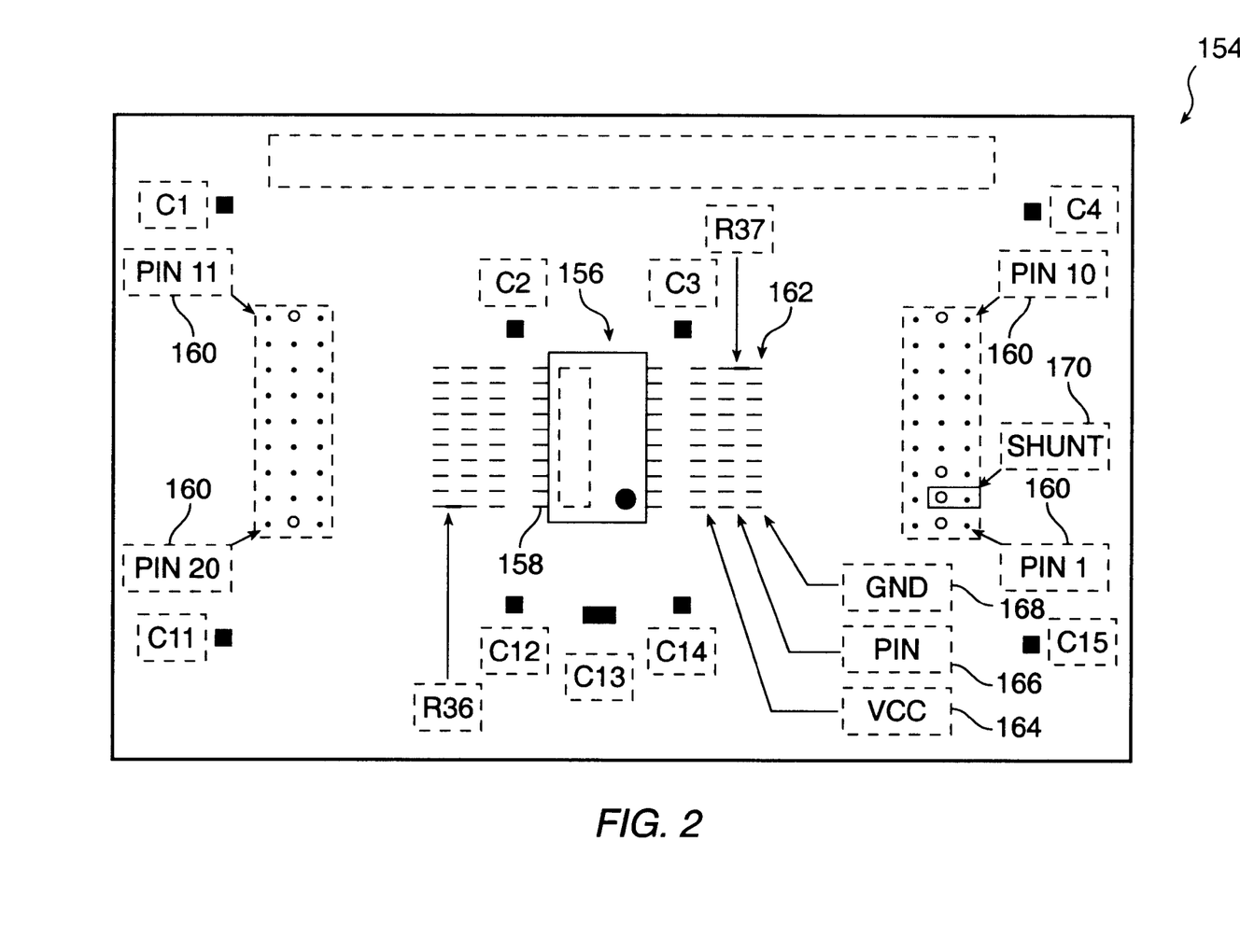
FIG. 2 illustrates a Design Under Test (DUT) Board used to house the device to be modeled according to a presently preferred embodiment of the present invention.

Referring now to FIG. 2, a Design Under Test (DUT) Board 154 used to house the device to be modeled according to a presently preferred embodiment of the present invention is illustrated. One of ordinary skill in the art will readily recognize that a DUT Board may be configured and built in a variety of ways. Once built, a device 156 to be modeled is provided, as well as a specification for the device 156. The device 156 includes a component capable of being mounted on a Printed Circuit Board (PCB). The device 156 has a plurality of pins 158, with each one of the plurality of pins being an input/receiver or an output/driver. Each receiver pin is adapted for receiving input, and each driver pin is adapted for driving a device either high or low. The device 156 is then placed on the DUT Board 154. The DUT Board 154 includes a plurality of test pins 160, each one of the plurality of device pins 158 corresponding to a different one of the plurality of test pins 160. As defined herein, a pin includes any electrical interface or connection point to which circuits of the device are connected. Each of the logic analyzer pods includes leads which are connected to corresponding test pins 160 of the DUT board which correspond to input/receiver pins of the device. Using the present invention, these input pins may be stimulated through a programmable sequence to toggle one or more output pins on the device. The output test pin of the DUT board corresponding to the driver pin of the device being modeled is connected to an output channel of the power supply. The DUT board further includes a power header 162 with access to three power/ground planes: a supply voltage VCC 164, a scalable voltage V_TEST 166, and ground voltage GND 168. In addition, an extra row of test pins are provided such that a physical pin can be jumpered to an internal 50 ohm resistor through means of a shunt 170 to allow accurate risetime/falltime measurements to be performed. Once all hardware is set up, each of the driver and receiver pins of the device may be separately modeled.

Different measurements must be performed when modeling receiver and driver pins. When modeling a driver pin, each driver pin requires high state and low state DC sweep measurements, as well as AC Risetime/Falltime measurements. In comparison, when modeling each receiver pin, each receiver pin requires only one DC sweep measurement.

According to a preferred embodiment of the present invention, during a DC sweep measurement, the voltage is stepped in 100 millivolt increments extending throughout and beyond the typical operating range of the device, and corresponding current measurements are recorded. For example, for a device having an operating range of 0 through 5 volts, a DC sweep may consist of stepping the voltage on an output pin from –2 volts through +7 volts in 100 millivolt increments, resulting in 90 data points where the associated current is recorded.

During an AC Risetime/Falltime measurement, the voltage is measured at a high frequency. For example, voltages are measured and recorded in 250 pico-second intervals when the oscilloscope is running in real mode, or 25 pico-second intervals when the oscilloscope is running in equivalent time mode. The equivalent time mode is recommended for devices with risetimes of less than 1 nanosecond. These time v. voltage data points may then be used to accurately predict the risetime and falltime of the driver.

According to a presently preferred embodiment of the present invention, the voltage is changed from low to high voltage for risetime measurements, and from high to low voltage for falltime measurements. Alternatively, one AC measurement may be made midway between the low and high voltages. Those of ordinary skill in the art will readily recognize that risetime and falltime measurements may be performed during this process.

Figure 3:
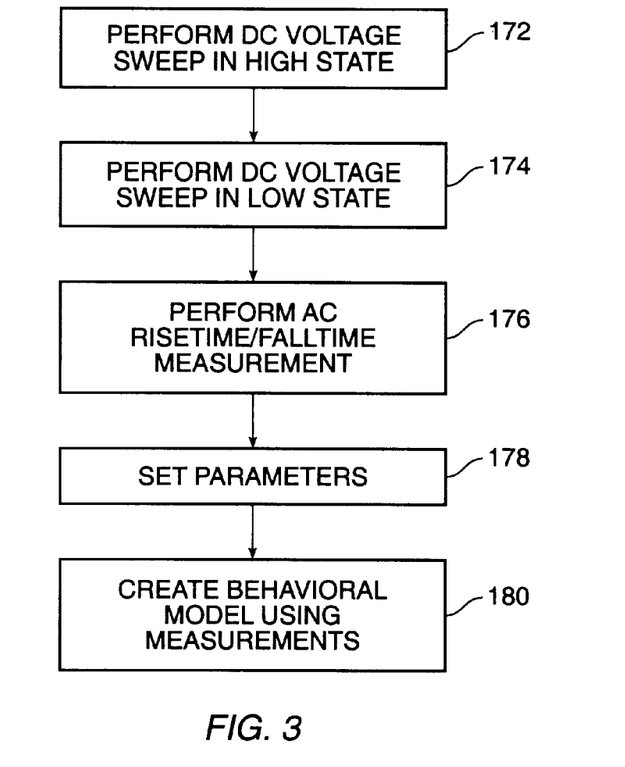
FIG. 3 illustrates a method for generating behavioral models for a driver or bidirectional pin according to a presently preferred embodiment of the present invention.

Referring now to FIG. 3, a method for generating behavioral models for a driver pin according to a presently preferred embodiment of the present invention is illustrated. First, at step 172, a DC voltage sweep is performed to measure the device over a range of voltages in its high state. Next, at step 174, a DC voltage sweep is performed to measure the device over a range of voltages in its low state. All driver pins require high state and low state DC sweep measurements. The device is in a high state when the driver pin is forced to a high voltage and is in a low state when the driver pin is forced to a low voltage. DC voltage-current (VI) characteristics are required for both inputs and outputs. The voltage sweep $V_S$ is dependent on the normal operating voltage range of a device and should be extended to reasonably cover any diode or transistor clamping. Usually $V_S$, the voltage sweep range, is −2.0 to 7.0 volts for TTL and CMOS devices. Next, at step 176, an AC Risetime/Falltime measurement is performed. At step 178, parameters may be modified, such as VL, VH, terminating resistance, total inductance, terminating voltages Vth and Vtl, and delay measurement voltage representing the voltage from which delays are measured. Predetermined defaults or values from a manufacturer data book may used to provide these values. Next, after having modeled the driver pin in both its high and low states, and having captured risetime/falltime measurements, at step 180, a behavioral model is created using these measurements which is compatible with signal integrity simulation software such as TLC, XTK, and QUIET. Thus, the acquired data is properly formatted for use with these signal integrity tools. According to a presently preferred embodiment of the present invention, "Create->BI-DRIVERSPEC" is selected from a main pull-down menu. Those of ordinary skill in the art will readily recognize that the above steps are illustrative only and may be performed in an alternate order.

Figure 4:
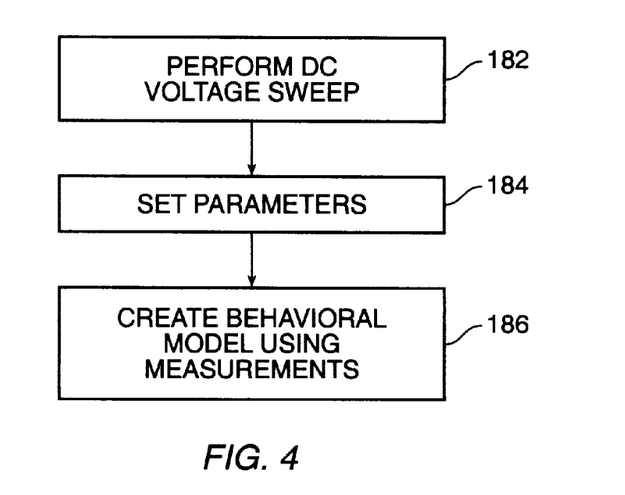
FIG. 4 illustrates a method for generating behavioral models for a receiver pin according to a presently preferred embodiment of the present invention.

Referring now to FIG. 4, a method for generating behavioral models for a receiver pin according to a presently preferred embodiment of the present invention is illustrated. First, at step 182, a DC voltage sweep is performed to measure the device over a range of voltages. At step 184, parameters required for model generation may be modified. These parameters may include the venin equivalent low voltage (VL), the venin equivalent high voltage (VH), low switching threshold voltage (Vtl), high switching threshold voltage (Vth), terminating resistance, total inductance, terminating voltage, and delay measurement voltage representing the voltage from which delays are measured. Predetermined defaults or values from a specified data book may used. Next, after having modeled the receiver pin, a behavioral model compatible with signal integrity simulation software such as TLC, XTK, and QUIET is created at step 186 using data acquired during the DC voltage sweep. According to a presently preferred embodiment of the present invention, "Create->RECEIVERSPEC" is selected from a main pull-down menu. Those of ordinary skill in the art will readily recognize that the above steps are illustrative only and may be performed in an alternate order.

Figure 5:
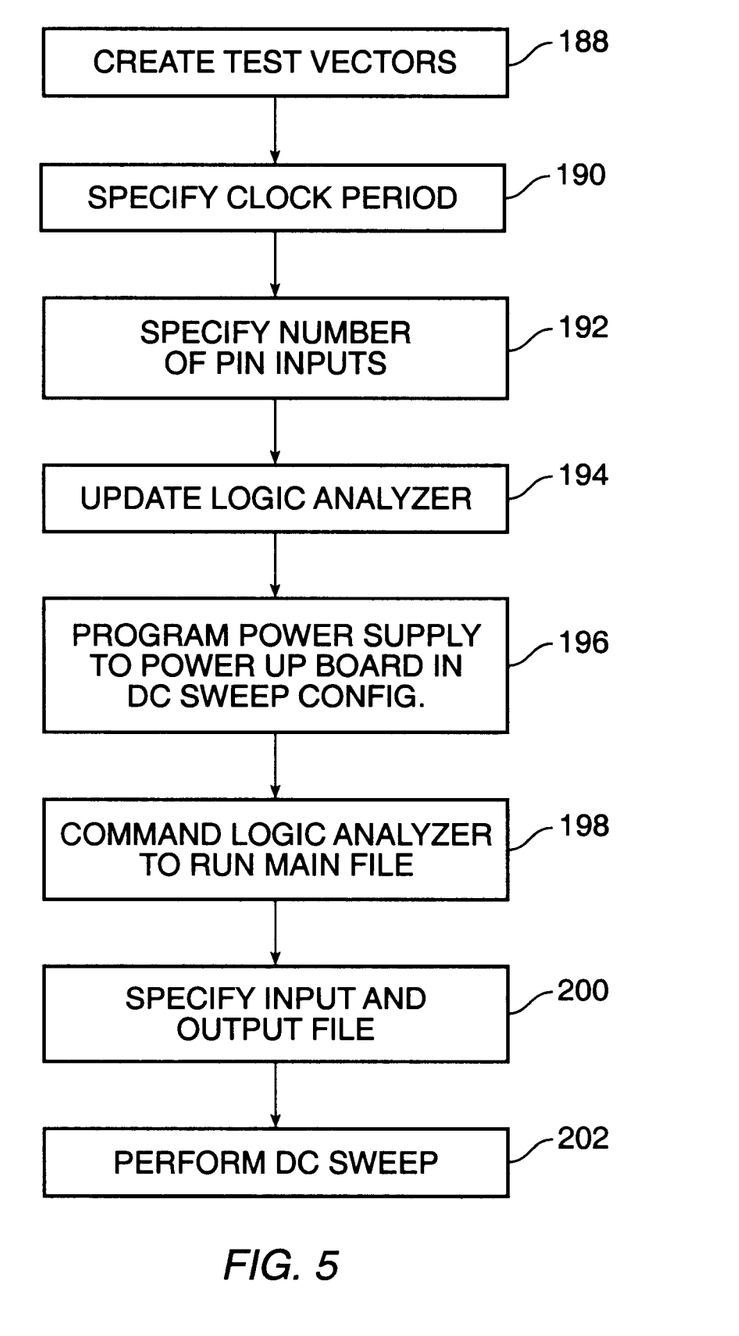
FIG. 5 illustrates a method for performing a DC voltage sweep according to a presently preferred embodiment of the present invention.

Referring now to FIG. 5, a method for performing a DC voltage sweep according to a presently preferred embodiment of the present invention is illustrated. A DC voltage sweep may be accomplished through performing the following steps. First, at step 188, a set of test vectors is created to stimulate the receiver pins, or inputs, of the device. According to a presently preferred embodiment of the present invention, a binary initialization file having a binary initialization sequence for the logic analyzer is created. For example, the user first selects "Binary Initialization File: Edit". The initialization sequence may be used to initialize the logic analyzer. However, since the logic analyzer needs to be initialized only once during component characterization, this step may be omitted. Assuming the binary initialization file is used, this file conforms to a format where each column in the file represents an input pin, and each row represents a test vector. The binary initialization file may then be converted from binary to hexadecimal format. For example, the user selects "Convert" under the Logic Analyzer. Alternatively, a user may create a hex file directly by selecting "Hex File: Edit". Similarly, a main binary sequence file is created which also conforms to a format where each column in the file represents an input pin, and each row represents a sequence. This file is then converted from binary to hexadecimal format to become compatible with the logic analyzer's internal software protocol. For example, the user may select "Binary Main File: Edit", followed by a "Convert" operation. The main binary file includes a plurality of test vectors, each one of the plurality of test vectors having a value corresponding to each pin of the device to be modeled. According to a presently preferred embodiment of the present invention, the main binary file comprises a plurality of columns and rows, with each one of the plurality of columns corresponding to a different pin of the device being modeled, and each one of the plurality of rows representing a test vector. One of ordinary skill in the art will readily recognize that only 20 vectors corresponding to input pins test data in (TDI), test mode select (TMS), and test clock (TCK) pins must be defined when used in combination with the JTAG boundary scan standard.

Next, at step 190, the clock period for the logic analyzer is specified. For example, a clock period in nanoseconds may be specified in the logic analyzer portion of the control panel. Next, at step 192, a number of pin inputs is specified. For example, a "Number of Inputs" may be specified in the logic analyzer portion of the control panel. The number of pin inputs corresponds to the number of columns within the main binary file, and optional initialization binary file. Next, at step 194, logic analyzer is updated with the hexadecimal initialization file (if enabled), the hexadecimal main file comprising the test vectors, and the user specified clock period and number of inputs. Therefore, the pattern generator is loaded with the main file comprising the test vectors. This may be accomplished by selecting "Load Sequence" in the logic analyzer portion of the control panel.

Next, at step 196, the power supply is programmed to power-up the board in the DC sweep configuration. According to a presently preferred embodiment of the present invention, the power supply may be configured at a specified voltage by setting a first channel to VCC, a second channel initialized for a DC voltage sweep at a user-specified range and interval, and a third channel is set to GND. For example, "DC 5V" followed by "Run DC Sweep" may be selected to sweep the voltage across a range defined by a first specified voltage and a second specified voltage. A specified interval (e.g., 0.1 Volts) may be selected in the Power Supply section of the control panel.

Next, at step 198, the logic analyzer is commanded to run the main hexadecimal file. Alternatively, a single step may be performed allowing one vector to be input. The main hexadecimal file is run in conjunction with the number of buffer pods required. According to a presently preferred embodiment of the present invention, five buffer pods are available. Since each buffer pod controls up to eight pins, a maximum of 40 channels can be stimulated. The number of input pins required for stimulation is dependent upon the binary main file associated with the loaded hexadecimal main file, as well as the optional binary initialization file associated with the hexadecimal initialization file. By selecting "Run Single" in the Logic Analyzer section of the control panel, one or more output pins are forced to toggle high or low.

Next, at step 200, an input file and output file for the DC voltage sweep may be specified. This may be performed by specifying an "Input VI File" and an "Output VI File" in the "Power Supply" section of the control panel. According to a presently preferred embodiment of the present invention, both the input file and the output file comprise a single format, the files having a first column representing a set voltage and a second column representing the measured current. Data is written to the output file specified. Thus, an output file may be used as a subsequent input file. The input file permits a user to superimpose a voltage-current measurement from an output file over other results. An input stimulation means is provided to stimulate each of the inputs, or receiver pins, while a current measurement means is provided to measure the current at each of the outputs, or driver pins. According to a presently preferred embodiment of the present invention, the input stimulation means comprises a logic analyzer, while the current measurement means comprises a power supply. Alternatively, the current measurement means may comprise a data acquisition module used with the logic analyzer. One of ordinary skill in the art will readily recognize that alternative means for stimulating the driver pin inputs and measuring the current at the driver pin outputs may be used.

Next, at step 202, a DC sweep is performed to measure the device over a range of voltages producing output to the specified output file. The DC voltage sweep operates to "sweep" the voltage of the pin being measured through and beyond the operating range of the device being modeled. For example, for a device having an operating range of 0V to 5V, a voltage sweep is performed from −2V to 7V. The current may then be measured using the power supply as described above and recorded at specified intervals, such as each tenth of a volt. Those of ordinary skill in the art will readily recognize that the above steps are illustrative only and may be performed in an alternate order.

Figure 6:
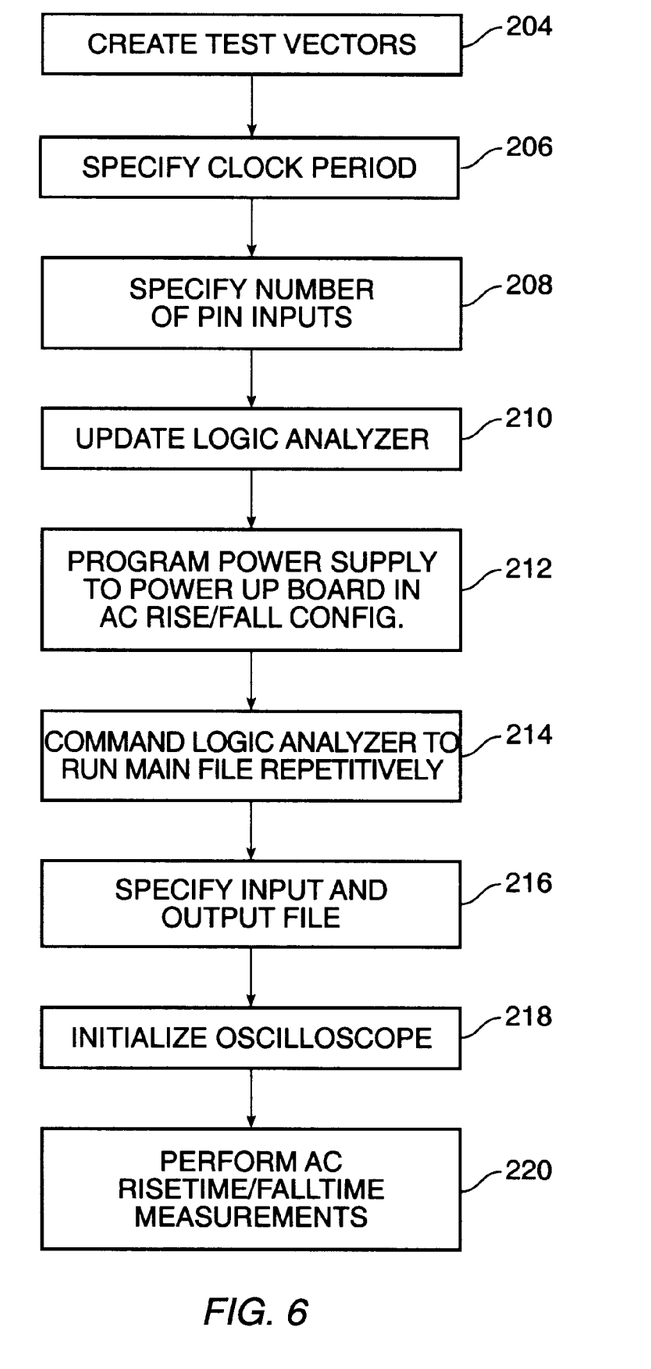
FIG. 6 illustrates a method for performing AC risetime/falltime measurements for a corresponding driver or bi-directional pin according to a presently preferred embodiment of the present invention.

Referring now to FIG. 6, a method for performing risetime/falltime measurements for a corresponding driver pin according to a presently preferred embodiment of the present invention is presented. First, at step 204, a set of test vectors is created to stimulate inputs of the device. According to a presently preferred embodiment of the present invention, a binary initialization file having a binary initialization sequence for the logic analyzer is created. For example, the user first selects "Binary Initialization File: Edit". The binary initialization file is then converted from binary to hexadecimal format in order to be compatible with the Logic Analyzer's internal software protocol. For example, the user selects "Convert" under the Logic Analyzer section of the control panel. Alternatively, a user may create a hexadecimal file directly by selecting "Hex File: Edit". As described above, the hexadecimal initialization file may be used to initialize the logic analyzer. Similarly, a main binary sequence file is created, which is then converted from binary to hexadecimal format. For example, the user may select "Binary Main File: Edit", followed by a "Convert" operation. The main binary file includes a plurality of test vectors, each one of the plurality of test vectors having a value corresponding to each pin of the device to be modeled. According to a presently preferred embodiment of the present invention, the main binary file comprises a plurality of columns and rows, with each one of the plurality of columns corresponding to a different pin of the device being modeled, and each one of the plurality of rows representing a test vector.

Next, at step 206, the clock period for the logic analyzer is specified. For example, a clock period in nanoseconds may be specified in the logic analyzer portion of the control panel. Next, at step 208, a number of pin inputs is specified. For example, a "Number of Inputs" may be specified in the logic analyzer portion of the control panel. The number of pin inputs corresponds to the number of input pins as described above. Next, at step 210, logic analyzer is updated with the initialization file, main file comprising the test vectors, and the user specified clock period and number of inputs. This may be accomplished by selecting "Load Sequence" in the logic analyzer portion of the control panel.

Next, at step 212, the power supply is programmed to power-up the DUT board in the AC Risetime/Falltime measurement configuration. For example, for a specified operating range, VCC, a first channel may be set to VCC, a second channel may be set to a voltage midway within the specified operating range (e.g., VCC/2), and a third channel may be set to GND. For example, this may be performed by selecting "AC 5V" in the "Power Supply" section of the control panel.

Next, at step 214, the logic analyzer is commanded to run the main hexadecimal file comprising the test vectors repetitively, resulting in the targeted output pin toggling high and low repetitively. This is accomplished by selecting "Run Repetitive" in the logic analyzer section of the control panel.

Next, at step 216, an input file and an output file may be specified. According to a presently preferred embodiment of the present invention, the input and output file comprise an identical format. For example, the files may include a first column representing time and a second column representing measured voltage. Measurements are recorded to the output file. Through the use of an input file, data in the input file can be superimposed on top of results. Thus, an output file may be used as a subsequent input file. AC measurements may then be performed and recorded. An input stimulation means is provided to stimulate the inputs, or receiver pins, while a voltage measurement means is provided to measure the voltages at the outputs, or driver pins. According to a presently preferred embodiment of the present invention, the input stimulation means comprises a logic analyzer, while the voltage measurement means comprises an oscilloscope. However, one of ordinary skill in the art will readily recognize that alternative input stimulation means and voltage measurement means may be used.

Prior to performing AC measurements, the oscilloscope must be initialized at step 218. The oscilloscope is placed in remote mode to enable software control. In addition, the sampling rate is set (e.g., 250 pico-second intervals are chosen by selecting a 4 GHz sampling rate), the edge trigger slope is set to "rising" or "falling", and the trigger voltage is set. This is accomplished by selecting "Initialize" under the "Oscilloscope" section of the control panel.

Next, at step 220, an AC risetime/falltime measurement is performed. "Run AC" is selected in the "Oscilloscope"

section of the control panel. Those of ordinary skill in the art will readily recognize that the above steps are illustrative only and may be performed in an alternate order.

Figure 7:
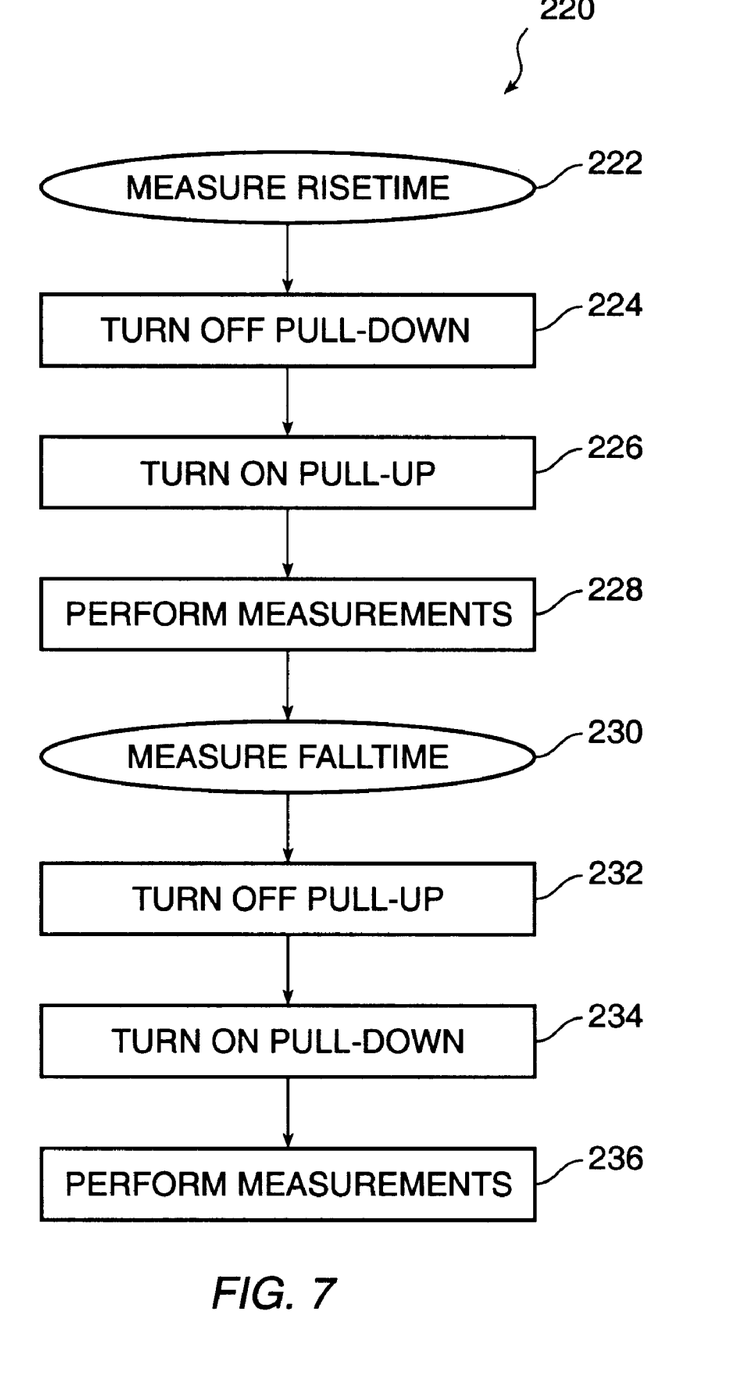
FIG. 7 illustrates a method for performing AC risetime/falltime measurements according to a presently preferred embodiment of the present invention.

Referring now to FIG. 7, a method for performing AC risetime/falltime measurements 220 according to a presently preferred embodiment of the present invention is illustrated. Using this method, AC risetime/falltime measurements may be more accurately performed. One of ordinary skill in the art of behavioral model generation will readily recognize that each driver will include an internal pull-up and pull-down, or equivalent behavior.

At step 222, risetime is measured when a first AC measurement is performed with a termination voltage of VH. When risetime is measured, the internal pull-down is turned off at step 224. Since the output is terminated to VH, the voltage begins to rise. Next, at step 226, the pull-up is turned on. At that time, the voltage increases to approximately VH. Measurements of the risetime may be performed using a clock triggered to determine the time between when each waveform begins to rise at step 228.

Next, at step 230, falltime is measured when a second AC measurement is performed with a termination voltage of VL. When falltime is measured, the internal pull-up is turned off at step 232. Since the output is terminated to VL, the voltage begins to fall. Next, at step 234, the pull-down is turned on. At that time, the voltage decreases to approximately VL. At step 236, measurements of the falltime may be performed using a clock triggered to determine the time between when each waveform begins to rise. Those of ordinary skill in the art will readily recognize that the above steps are illustrative only and may be performed in an alternate order.

Through the use of the above-described invention, a behavioral model compatible with signal integrity tools may be created for a given component. According to a presently preferred embodiment of the present invention, the behavioral model is produced in ASCII format. A user may then further modify this behavioral model to include various parameters, such as ground bounce. For example, ground bounce may be included by following the syntax of a XTK User's Manual using ground bounce data. The ground bounce data may be acquired using a network analyzer or time domain reflectometer (TDR). Alternatively, this information may be taken from a manufacturer Data Book.

Figure 8:
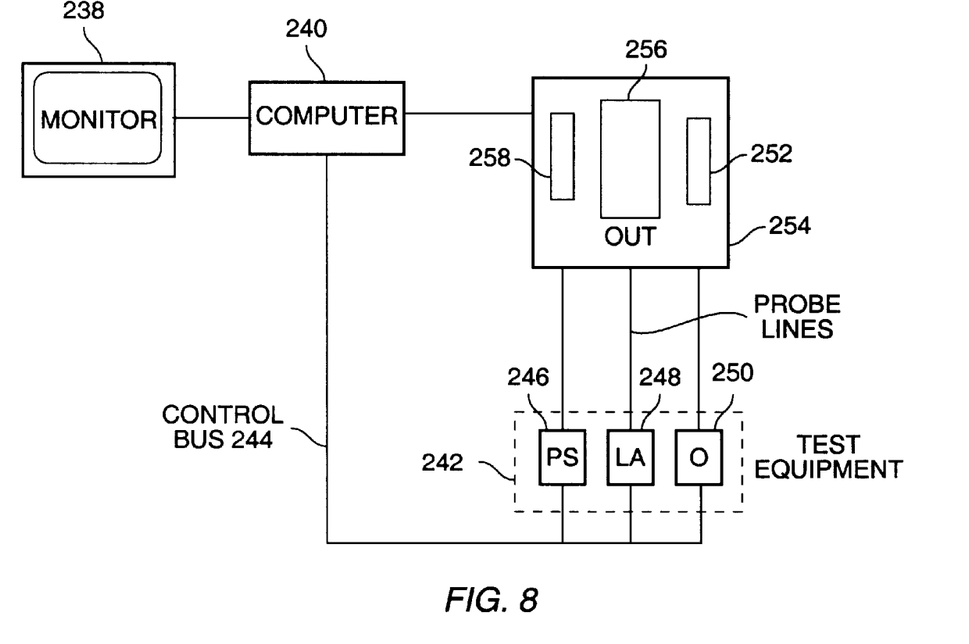
FIG. 8 illustrates a block diagram of a system configuration according to a presently preferred embodiment of the present invention.

Referring now to FIG. 8, a block diagram of a system configuration according to a presently preferred embodiment of the present invention is illustrated. As shown, a computer monitor 238 is provided for presenting the control panel 10 of FIG. 1. A computer 240 is provided to control the computer monitor 238 and a set of test equipment 242 via a control bus 244. The test equipment 242 may include a power supply 246, a logic analyzer 248, and an oscilloscope 250. The power supply 246 is operatively coupled to the power header 252 of the design-under-test board 254. The logic analyzer 248 is connected to the receiver pins of the component 256 through corresponding test pins 258 of the design-under-test board 254. The oscilloscope 250 is operatively coupled to the driver pins of the component 256 through corresponding test pins 258 of the design-under-test board 254. This test equipment is controlled by the control panel, as described above.

Figure 9:
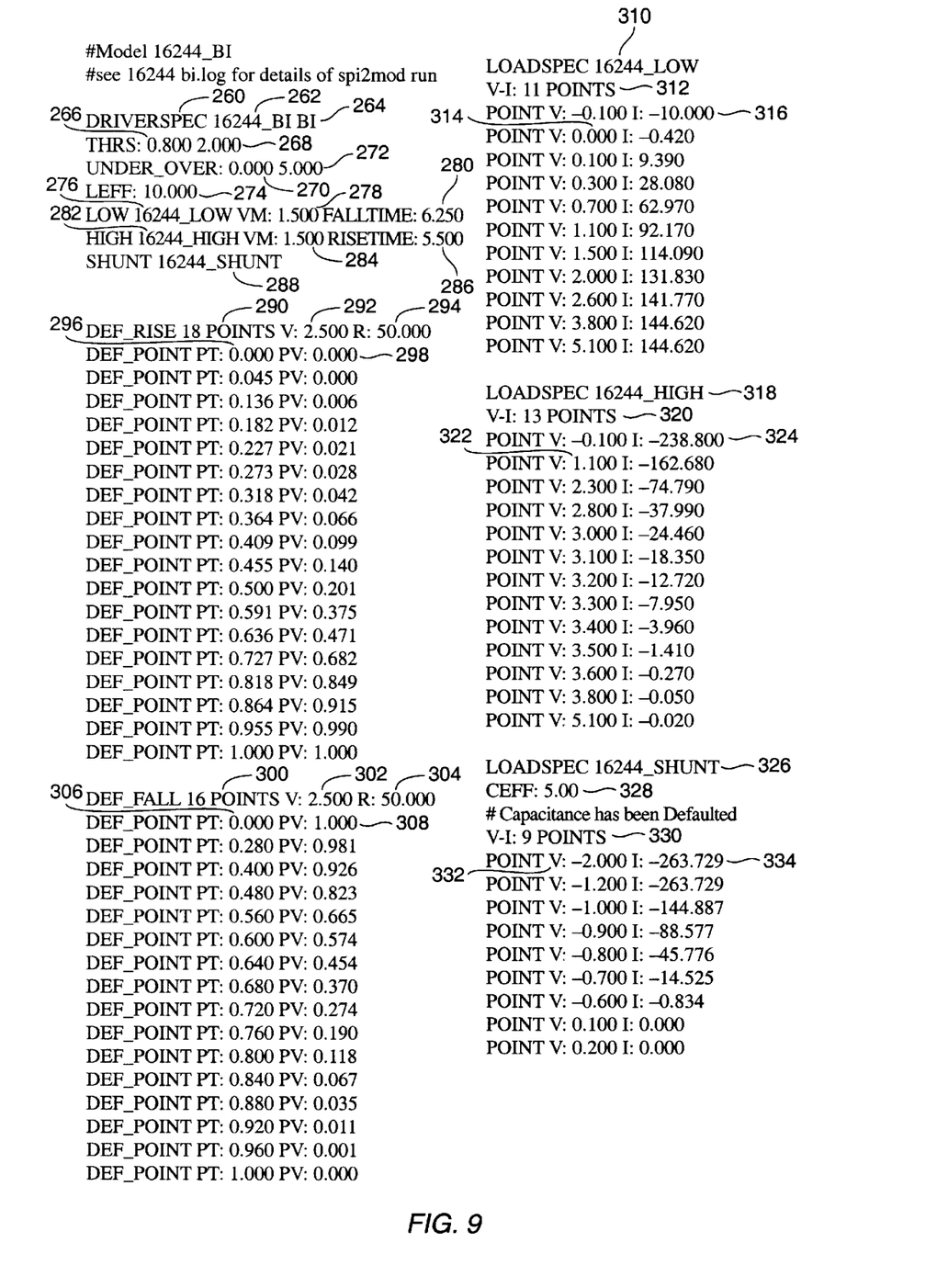
FIG. 9 illustrates a model file corresponding to a behavioral model produced according to a presently preferred embodiment of the present invention.

Referring now to FIG. 9, a model file corresponding to a behavioral model for a driver pin produced according to a presently preferred embodiment of the present invention is illustrated. A keyword 260, DRIVERSPEC, is used to denote a driver, rather than a receiver. A user defined pin name 262, and pin type 264 are provided. For example, the pin type 264 may be BI to denote a bidirectional pin, while UNI may be used to denote a unidirectional pin. Logical switching voltage thresholds 266, 268 are presented which indicate the minimum and maximum voltages at which the signal switches from a logical low to high (on the rising edge), or a logical low to high (on the falling edge). In addition, undershoot 270 and overshot 272 voltages are included which indicate the expected minimum and maximum voltage ranges of the signal, respectively. Total inductance 274 of the device is provided. A low state curve definition 276 including a delay measurement voltage 278 and falltime 280 is included. A high state curve definition 282 including the delay measurement voltage 284 and a risetime 286 is included. A shunt 288 defined by a current-voltage curve for the above and below operating range characteristics of the device is provided for a clamping diode effect.

A risetime definition is provided. The number of points 290 is included, in addition to a voltage load 292 and a resistive load 294. Each point is defined by a time 296 and a voltage 298. Similarly, a falltime definition is provided. The number of points 300 is provided, in addition to a voltage load 302 and a resistive load 304. Each point is defined by a time 306 and a voltage 308.

The driver pin is modeled in its low state through a number of points defining a non-linear voltage vs. current curve 310. A number of points 312 is provided, and a voltage 314 and current 316 is provided for each point on the curve. Similarly, the driver pin is modeled in its high state through a number of points defining a non-linear voltage vs. current curve 318. A number of points 320 is provided, and a voltage 322 and current 324 is provided for each point on the curve.

The shunt 326 is modeled according to a given capacative load 328. A voltage vs. current curve is defined by a number of points 330. Each point is defined by a voltage 332 and corresponding current 334.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A method for generating a behavioral model for a device, the device having a plurality of driver pins and a plurality of receiver pins, the method comprising:

connecting the plurality of driver and receiver pins to a test apparatus including an input stimulation means, a voltage measurement means, and a current measurement means;

stimulating a first set of the plurality of receiver pins using the input stimulation means;

performing voltage measurements at selected ones of the plurality of driver pins using the voltage measurement means;

stimulating a second set of the plurality of receiver pins using the input stimulation means;

performing current measurements at selected ones of the plurality of driver pins using the current measurement means; and creating the behavioral model without using a functional model, said creating using the voltage measurements and the current measurements.

2. A method for modeling a device, the device having a plurality of driver pins and a plurality of receiver pins, the method comprising:

connecting the plurality of driver and receiver pins to a test apparatus including an input stimulation means, a voltage measurement means, and a current measurement means;

stimulating a first set of the plurality of receiver pins using the input stimulation means;

performing voltage measurements at selected ones of the plurality of driver pins using the voltage measurement means;

stimulating a second set of the plurality of receiver pins using the input stimulation means;

performing current measurements at selected ones of the plurality of driver pins using the current measurement means;

creating the behavioral model using the voltage measurements and the current measurements;

providing the behavioral model as an input to signal integrity simulation software; and using the signal integrity simulation software to model the device.

3. The method according to claim 1, wherein the test apparatus comprises a device-under-test board.

4. The method according to claim 1, the method further comprising:

repeating said connecting, said stimulating, said performing, and said creating for each one of a plurality of identical devices; and averaging the voltage and current measurements performed for each one of the plurality of identical devices.

5. A method for generating a behavioral model for a device, the device having a plurality of driver pins and a plurality of receiver pins, the method comprising:

connecting the plurality of driver and receiver pins to a test apparatus including an input stimulation means, a voltage measurement means, and a current measurement means;

performing an AC risetime/falltime measurement for each one of the plurality of driver pins using the input stimulation means and the voltage measurement means to obtain a set of AC voltage measurements;

performing a DC voltage sweep measurement for each one of the plurality of driver pins using the input stimulation means and the current measurement means to obtain a first set of DC current measurements;

performing a DC voltage sweep measurement for each one of the plurality of receiver pins using the input stimulation means and the current measurement means to obtain a second set of DC current measurements; and generating the behavioral model for the device without using a functional model, said generating using the set of AC voltage measurements, the first set of DC current measurements, and the second set of DC current measurements.

6. A method for modeling a device, the device having a plurality of driver pins and a plurality of receiver pins, the method comprising:

connecting the plurality of driver and receiver pins to a test apparatus including an input stimulation means, a voltage measurement means, and a current measurement means;

performing an AC risetime/falltime measurement for each one of the plurality of driver pins using the input stimulation means and the voltage measurement means to obtain a set of AC voltage measurements;

performing a DC voltage sweep measurement for each one of the plurality of driver pins using the input stimulation means and the current measurement means to obtain a first set of DC current measurements;

performing a DC voltage sweep measurement for each one of the plurality of receiver pins using the input stimulation means and the current measurement means to obtain a second set of DC current measurements;

generating the behavioral model for the device using the set of AC voltage measurements, the first set of DC current measurements, and the second set of DC current measurements;

providing the behavioral model as an input to signal integrity simulation software; and using the signal integrity simulation software to model the device.

7. The method according to claim 5, wherein the input stimulation means comprises a logic analyzer.

8. The method according to claim 5, wherein the voltage measurement means comprises an oscilloscope.

9. The method according to claim 5, wherein the current measurement means comprises a power supply.

10. The method according to claim 5, wherein the current measurement means comprises a data acquisition module and a logic analyzer.

11. The method according to claim 5, wherein said performing a DC measurement for each one of the plurality of driver pins further comprises:

performing a sweep of the DC voltage input power to the device over a range of voltages.

12. The method according to claim 5, wherein said performing a DC measurement for each one of the plurality of receiver pins further comprises performing a sweep of the DC voltage input power to the device over a range of voltages.

13. The method according to claim 5, wherein said performing a DC measurement for each one of the plurality of driver pins further comprises:

performing a sweep of the DC voltage input power to the device over a range of voltages, the device being in a high state; and performing a sweep of the DC voltage input power to the device over a range of voltages, the device being in a low state.

14. The method according to claim 5, wherein said generating further comprises:

recording the AC risetime/falltime measurements for each one of the plurality of driver pins;

recording the DC measurement for each one of the plurality of driver pins;

recording the DC measurement for each one of the plurality of receiver pins; and creating a behavioral model from the recorded AC and DC measurements corresponding to each one of the plurality of driver and receiver pins.

15. The method according to claim 14, wherein said creating further comprises providing parameters required by the signal integrity simulation software.

16. The method according to claim 5, wherein said performing a DC voltage sweep measurement for each one of the plurality of driver pins further comprises:

performing high state DC voltage sweep measurements for each one of the plurality of driver pins; and performing low state DC voltage sweep measurements for each one of the plurality of driver pins.

17. The method according to claim 11, wherein said performing a DC voltage sweep further comprises:
creating a set of test vectors to stimulate the receiver pins of the device;
loading the set of test vectors in a logic analyzer;
programming a power supply to power-up a DUT board in a DC voltage sweep configuration;
commanding the logic analyzer to run the set of test vectors;
sweeping voltage according to the DC voltage sweep configuration; and
measuring current corresponding the DC voltage sweep configuration.

18. The method according to claim 17, wherein said loading further comprises:
specifying a clock period for the logic analyzer; and
specifying a number of receiver pins corresponding to the set of test vectors.

19. The method according to claim 11, wherein said performing a DC voltage sweep further comprises:
creating a set of test vectors to stimulate the receiver pins of the device;
loading the set of test vectors in a logic analyzer;
programming a power supply to power-up a DUT board in a DC voltage sweep configuration;
commanding the logic analyzer to run at least one of the set of test vectors;
sweeping voltage according to the DC voltage sweep configuration; and
measuring current corresponding the DC voltage sweep configuration.

20. The method according to claim 12, wherein said performing a DC voltage sweep further comprises:
creating a set of test vectors to stimulate at least one of the plurality of receiver pins of the device;
loading the set of test vectors in a logic analyzer;
programming a power supply to power-up a DUT board in a DC voltage sweep configuration;
commanding the logic analyzer to run the set of test vectors;
sweeping voltage according to the DC voltage sweep configuration; and
measuring current corresponding the DC voltage sweep configuration.

21. The method according to claim 20, wherein said loading further comprises:
specifying a clock period for the logic analyzer; and
specifying a number of receiver pins corresponding to the set of test vectors.

22. The method according to claim 12, wherein said performing a DC voltage sweep further comprises:
creating a set of test vectors to stimulate at least one of the plurality of receiver pins of the device;
loading the set of test vectors in a logic analyzer;
programming a power supply to power-up a DUT board in a DC voltage sweep configuration;
commanding the logic analyzer to run at least one of the set of test vectors;
sweeping voltage according to the DC voltage sweep configuration; and
measuring current corresponding the DC voltage sweep configuration.

23. The method according to claim 5, wherein said performing AC risetime/falltime measurements further comprises:
creating a set of test vectors to stimulate at least one of the plurality of receiver pins of the device;
loading the set of test vectors in a logic analyzer;
programming a power supply to power-up a DUT board in an AC risetime/falltime configuration;
commanding the logic analyzer to run the set of test vectors repetitively; and
performing AC risetime/falltime measurements.

24. The method according to claim 23, wherein said performing further comprises:
initializing an oscilloscope; and
performing AC risetime/falltime measurements using the oscilloscope.

25. The method according to claim 24, wherein said initializing further comprises:
placing the oscilloscope in remote mode;
setting a sampling rate;
setting an edge trigger slope; and
setting a trigger voltage.

26. The method according to claim 23, wherein said performing further comprises:
performing a risetime measurement; and
performing a falltime measurement.

27. The method according to claim 26, wherein said performing a risetime measurement further comprises:
turning an internal pull-down off; and
turning an internal pull-up on.

28. The method according to claim 26, wherein said performing a falltime measurement further comprises:
turning an internal pull-up off; and
turning an internal pull-down on.

29. The method according to claim 23, wherein said loading further comprises specifying a number of receiver pins.

30. The method according to claim 23, wherein said commanding further comprises:
specifying a clock period for the logic analyzer; and
running the logic analyzer with at least one of the set of test vectors.

31. A method for generating a behavioral model for a driver pin of a device, the device having a plurality of driver pins and a plurality of receiver pins, the driver pin being one of the plurality of driver pins, the method comprising:
connecting the plurality of driver and receiver pins to a test apparatus including an input stimulation means, a voltage measurement means, and a current measurement means;
performing an AC risetime/falltime measurement for the driver pin using the input stimulation means and the voltage measurement means to obtain a set of AC voltage measurements;
performing a DC voltage sweep measurement for the driver pin using the input stimulation means and the current measurement means to obtain a set of DC current measurements; and
generating the behavioral model for the driver pin without using a functional model, said generating using the set of AC voltage measurements and the set of DC current measurements.

32. A method for modeling a driver pin of a device, the device having a plurality of driver pins and a plurality of receiver pins, the driver pin being one of the plurality of driver pins, the method comprising:

connecting the plurality of driver and receiver pins to a test apparatus including an input stimulation means, a voltage measurement means, and a current measurement means;

performing an AC risetime/falltime measurement for the driver pin using the input stimulation means and the voltage measurement means to obtain a set of AC voltage measurements;

performing a DC voltage sweep measurement for the driver pin using the input stimulation means and the current measurement means to obtain a set of DC current measurements;

generating the behavioral model for the driver pin using the set of AC voltage measurements and the set of DC current measurements;

providing the behavioral model as an input to signal integrity simulation software; and using the signal integrity simulation software to model the device.

33. The method according to claim 31, wherein said performing a DC voltage sweep measurement further comprises performing a DC voltage sweep to measure the driver pin over a range of voltages.

34. The method according to claim 31, wherein said performing a DC voltage sweep further comprises:

performing a DC voltage sweep to measure the driver pin over a range of voltages, the driver pin being in a high state; and performing a DC voltage sweep to measure the driver pin over a range of voltages, the driver pin being in a low state.

35. The method according to claim 31, wherein said generating further comprises:

recording the AC risetime/falltime measurement for the driver pin;

recording the DC measurement for the driver pin; and creating the behavioral model from the recorded AC and DC measurements corresponding to the driver pin.

36. The method according to claim 35, wherein said creating further comprises providing parameters required by the signal integrity simulation software.

37. The method according to claim 31, wherein said performing a DC voltage sweep further comprises:

performing a high state DC voltage sweep measurement for the driver pin; and performing a low state DC voltage sweep measurement for the driver pin.

38. The method according to claim 37, wherein each of said performing high state DC voltage sweep measurements and said performing low state DC voltage sweep measurements further comprises:

creating a set of test vectors to stimulate at least one receiver pin of the component;

loading the set of test vectors in a logic analyzer;

programming a power supply to power-up a DUT board in a DC voltage sweep configuration;

commanding the logic analyzer to run the set of test vectors;

sweeping voltage according to the DC voltage sweep configuration; and measuring current corresponding the DC voltage sweep configuration.

39. The method according to claim 38, wherein said loading further comprises:

specifying a clock period for the logic analyzer; and specifying a number of receiver pins corresponding to the set of test vectors.

40. The method according to claim 38, wherein said commanding further comprises running the logic analyzer with at least one of the set of test vectors.

41. The method according to claim 31, wherein said performing an AC risetime/falltime measurement further comprises:

creating a set of test vectors to stimulate at least one receiver pin of the component;

loading the set of test vectors in a logic analyzer;

programming a power supply to power-up a DUT board in an AC risetime/falltime configuration;

commanding the logic analyzer to run the set of test vectors repetitively; and performing AC risetime/falltime measurements.

42. The method according to claim 41, wherein said performing further comprises:

initializing an oscilloscope; and performing AC risetime/falltime measurements using the oscilloscope.

43. The method according to claim 42, wherein said initializing further comprises:

placing the oscilloscope in remote mode;

setting a sampling rate;

setting an edge trigger slope; and setting a trigger voltage.

44. The method according to claim 41, wherein said performing further comprises:

performing a risetime measurement; and performing a falltime measurement.

45. The method according to claim 44, wherein said performing a risetime measurement further comprises:

turning an internal pull-down off; and turning an internal pull-up on.

46. The method according to claim 41, wherein said loading further comprises:

specifying a clock period for the logic analyzer; and specifying a number of receiver pins.

47. The method according to claim 41, wherein said commanding further comprises running the logic analyzer with at least one of the set of test vectors.

48. A method for generating a behavioral model for a receiver pin of a device, the device having a plurality of driver pins and a plurality of receiver pins, the receiver pin being one of the plurality of receiver pins, the method comprising:

connecting the plurality of driver and receiver pins to a test apparatus including an input stimulation means and a current measurement means;

performing a DC voltage sweep measurement for the receiver pin using the input stimulation means and the current measurement means to obtain a set of DC current measurements; and generating the behavioral model for the receiver pin without using a functional model, said generating using the set of DC current measurements.

49. A method for modeling a receiver pin of a device, the device having a plurality of driver pins and a plurality of receiver pins, the receiver pin being one of the plurality of receiver pins, the method comprising:

connecting the plurality of driver and receiver pins to a test apparatus including an input stimulation means and a current measurement means;

performing a DC voltage sweep measurement for the receiver pin using the input stimulation means and the current measurement means to obtain a set of DC current measurements;

generating the behavioral model for the receiver pin using the set of DC current measurements;

providing the behavioral model as an input to signal integrity simulation software; and using the signal integrity simulation software to model the device.

50. The method according to claim 48, wherein said performing further comprises performing a DC voltage sweep to measure the receiver pin over a range of voltages.

51. The method according to claim 48, wherein said generating further comprises:

recording the DC measurement; and creating a behavioral model from the recorded DC measurement corresponding to the receiver pin.

52. The method according to claim 51, wherein said creating further comprises providing parameters required by the signal integrity simulation software.

53. The method according to claim 50, wherein said performing a DC voltage sweep further comprises:

creating a set of test vectors to stimulate the receiver pin;

loading the set of test vectors in a logic analyzer;

programming a power supply to power-up a DUT board in a DC voltage sweep configuration;

commanding the logic analyzer to run the set of test vectors;

sweeping voltage according to the DC voltage sweep configuration; and measuring current corresponding the DC voltage sweep configuration.

54. The method according to claim 53, wherein said loading further comprises:

specifying a clock period for the logic analyzer; and specifying a number of receiver pins corresponding to the set of test vectors.

55. The method according to claim 53, wherein said commanding further comprises running the logic analyzer with at least one of the set of test vectors.

56. An apparatus for generating a behavioral model for a device, the device having a plurality of driver pins and a plurality of receiver pins, comprising:

means for providing a DUT board;

means for placing the device on the DUT board;

means for performing an AC risetime/falltime measurement for each one of the plurality of driver pins to obtain a set of AC voltage measurements;

means for performing a DC measurement for each one of the plurality of driver pins to obtain a first set of DC current measurements;

means for performing a DC measurement for each one of the plurality of receiver pins to obtain a second set of DC current measurements; and means for generating the behavioral model without using a functional model, said means for generating using the set of AC voltage measurements, the first set of DC current measurements, and the second set of DC current measurements.

57. An apparatus for generating a behavioral model for a driver pin of a device, the device having a plurality of driver pins and a plurality of receiver pins, the driver pin being one of the plurality of driver pins, comprising:

means for providing a DUT board;

means for placing the device on the DUT board;

means for performing an AC risetime/falltime measurement for the driver pin;

means for performing a DC measurement for the driver pin; and means for generating the behavioral model without using a functional model, said means for generating using the AC and DC measurements performed for the driver pin.

58. An apparatus for generating a behavioral model for a receiver pin of a device, the device having a plurality of driver pins and a plurality of receiver pins, the receiver pin being one of the plurality of receiver pins, comprising:

means for providing a DUT board;

means for placing the device on the DUT board;

means for performing a DC measurement for the receiver pin; and means for generating the behavioral model without using a functional model, said means for generating using the DC measurement.

59. An apparatus for generating a behavioral model for a device, the device having a plurality of driver pins and a plurality of receiver pins, comprising:

means for providing a test apparatus including an input stimulation means, a voltage measurement means, and a current measurement means;

means for connecting the device to the test apparatus;

means for performing an AC risetime/falltime measurement for each one of the plurality of driver pins using the input stimulation means and the voltage measurement means to obtain a set of AC voltage measurements;

means for performing a DC measurement for each one of the plurality of driver pins using the input stimulation means and the current measurement means to obtain a first set of DC current measurements;

means for performing a DC measurement for each one of the plurality of receiver pins using the input stimulation means and the current measurement means to obtain a second set of DC current measurements; and means for generating the behavioral model without using a functional model, said means for generating using the set of AC voltage measurements, the first set of DC current measurements, and the second set of DC current measurements.

60. An apparatus for generating a behavioral model for a driver pin of a device, the device having a plurality of driver pins and a plurality of receiver pins, the driver pin being one of the plurality of driver pins, comprising:

means for providing a test apparatus including an input stimulation means, a voltage measurement means, and a current measurement means;

means for connecting the device to the test apparatus;

means for performing an AC risetime/falltime measurement for the driver pin using the input stimulation means and the voltage measurement means to obtain a set of AC voltage measurements;

means for performing a DC measurement for the driver pin using the input stimulation means and the current measurement means to obtain a set of DC current measurements; and means for generating the behavioral model without using a functional model, said means for generating using the set of AC voltage measurements and the set of DC current measurements.

61. An apparatus for generating a behavioral model for a receiver pin of a device, the device having a plurality of driver pins and a plurality of receiver pins, the receiver pin being one of the plurality of receiver pins, comprising:

means for providing a test apparatus including an input stimulation means, a voltage measurement means, and a current measurement means;

means for connecting the device to the test apparatus;

means for performing a DC measurement for the receiver pin using the input stimulation means and the current measurement means to obtain a set of DC current measurements; and means for generating the behavioral model without using a functional model, said means for generating using the set of DC current measurements.

* * * * *